United States Patent
Schuegraf et al.

[11] Patent Number: 5,830,793
[45] Date of Patent: Nov. 3, 1998

[54] METHOD OF SELECTIVE TEXFTURING FOR PATTERNED POLYSILICON ELECTRODES

[75] Inventors: Klaus F. Schuegraf; Pierre C. Fazan; Thomas A. Figura, all of Boise, Id.

[73] Assignee: Micron Technology, Inc., Boise, Id.

[21] Appl. No.: 579,238

[22] Filed: Dec. 28, 1995

[51] Int. Cl.⁶ .................................................. H01L 21/8242
[52] U.S. Cl. .......................... 438/255; 438/398; 438/254; 438/397
[58] Field of Search .................................. 438/298, 255, 438/239, 253, 254, 397, 396

[56] References Cited

U.S. PATENT DOCUMENTS

| | | | |
|---|---|---|---|
| Re. 35,420 | 1/1997 | Cathey et al. | 438/398 |
| 4,497,683 | 2/1985 | Celler et al. | 438/481 |
| 5,102,832 | 4/1992 | Tuttle . | |
| 5,112,773 | 5/1992 | Tuttle . | |
| 5,366,917 | 11/1994 | Wantanabe et al. . | |
| 5,658,381 | 8/1997 | Thakur et al. | 438/398 |

OTHER PUBLICATIONS

H. Wantanabe et al., "An Advanced Tecnique for Fabricating Hemispherical–Grained (HSF) Silicon Storage Devices", IEEE Transactions on Electron Devices, vol. 42, No. 2, Feb. 1995.

M. Sakao et al., "A Capacitor–Over–Bit–Line (COB) Cell with a Hemispherical–Grain Storage Note for 4 MB DRAMs", International Electron Devices Meeting 1990., San Francisco, CA USA, 9–12 Dec. 1990.

*Primary Examiner*—Tuan H. Nguyen
*Attorney, Agent, or Firm*—Knobbe, Martens, Olson & Bear, LLP

[57] ABSTRACT

Polysilicon or amorphous silicon electrodes are selectively texturized with respect to neighboring dielectric surfaces. Selectivity of texturizing is partially accomplished by exploiting differences in seed incubation time on silicon as compared to neighboring surfaces. The texturizing process is made substantially completely selective by a texturizing post-etch, which selectively removes parasitic deposits from surfaces adjacent to the silicon electrodes. Selectively texturized electrodes represent a significant improvement in DRAM process integration.

17 Claims, 5 Drawing Sheets

5,830,793

METHOD OF SELECTIVE TEXFTURING FOR PATTERNED POLYSILICON ELECTRODES

FIELD OF INVENTION

The invention relates generally to silicon integrated circuit processing. In particular the invention pertains to processes for texturing patterned polysilicon electrodes.

BACKGROUND OF THE INVENTION

A dynamic random access memory (DRAM) cell typically comprises a charge storage capacitor (or cell capacitor) coupled to an access device such as a Metal-Oxide-Semiconductor Field Effect Transistor (MOSFET). The MOSFET functions to apply or remove charge on the capacitor, thus affecting a logical state defined by the stored charge. The amount of charge stored on the capacitor is determined by the capacitance, $C=\epsilon A/d$, where $\epsilon$ is the dielectric constant of the capacitor dielectric, A is the electrode (or storage node) area and d is the interelectrode spacing. The conditions of DRAM operation such as operating voltage, leakage rate and refresh rate, will in general mandate that a certain minimum charge be stored by the capacitor.

In the trend to higher memory capacity, the packing density of cell capacitors has increased at the expense of available cell area. The area allowed for a single cell in a 64-Mbit DRAM is about 1.4 $\mu m^2$. In such limited areas, it is difficult to provide sufficient capacitance using conventional stacked capacitor structures. To maintain the cell capacitance in the face of small lateral cell dimensions, one technique has been to utilize so-called "textured" electrodes. A textured electrode typically comprises a polysilicon (or poly) or amorphous silicon (a-Si) material having an irregular or rough surface morphology. A textured electrode in a cell capacitor is processed in a manner producing an increased surface area with respect to the available lateral dimension. For example, patterned poly or a-Si is subjected to a seeding process, whereby a desired density of incubation sites are generated. Subsequently, the seeded electrodes are annealed at temperatures which induce atomic surface migration of silicon. The incubation sites present a significantly lower local diffusivity of silicon atoms, causing local accumulation of material. The result is a textured electrode, often having a hemispherically grained morphology (Hemispherically Grained Silicon or HGS), with enhanced surface area. U.S. Pat. No. 5,102,832 by Tuttle, herein incorporated by reference, discloses a method for texturizing polysilicon involving generating nucleation sites for subsequent poly deposition. H. Watanabe et al. (IEEE Tran. Electr. Dev., vol. 42, no. 2, February 1995, pp. 295–299), also herein incorporated by reference, disclose texturizing a-Si by ultra-high-vacuum annealing. To complete capacitor formation, the textured electrode is subsequently covered with a dielectric layer and counter electrode to form a storage capacitor having enhanced charge storage capability.

For DRAM applications, it is often the case that arrays of such structures are fabricated on a dielectric base layer, such as a silicon dioxide ($SiO_2$ or "oxide") or borophosphosilicate glass (BPSG) interlayer dielectric. Under these circumstances, the texturizing process can leave poly deposits on the neighboring dielectric layer, compromising device isolation. Post-texturizing etch process can remove the parasitic deposits, but in general they will also affect the texturized electrodes. Thus, it is desirable to selectively texturize the poly electrodes, while minimizing parasitic poly formation on the dielectric surface. The prior art selective texturization of poly electrodes exploits differences of incubation time of deposition on the dielectric with respect to the poly surfaces. The choice of seeding and incubation time therefore reflects a compromise between selectivity and the amount of texturization. Thus, a highly textured electrode is often accompanied by undesirable, parasitic poly deposits on the dielectric surface.

In light of this trade-off, it would be highly desirable to have a texturizing process which provides enhanced electrode surface area while eliminating parasitic poly deposits.

SUMMARY OF THE INVENTION

An object of the present invention is to provide a means to selectively texturize polysilicon electrodes used in DRAM applications and the like. Another object of the present invention is to provide a simple, cost effective process for texturing a plurality of closely spaced electrodes while minimizing such texturing in regions between them. Consistent with these objects and in accordance with one aspect of the present invention a texturizing process comprises first seeding a semiconductor surface which is juxtaposed on a substrate surface. The seeded surface is then annealed, and semiconductor deposits are removed from the substrate surface. A preferred seeding process comprises chemical vapor depositing a material such as silicon, which induces nucleation sites substantially selectively on the semiconductor surface. A preferred anneal comprises heating the semiconductor surface to induce a texturized morphology. Removing semiconductor deposits from the substrate is preferably accomplished by means of substantially selectively etching the substrate surface.

In accordance with another aspect of the present invention, a textured semiconductor structure is formed by first providing a semiconductor material juxtaposed on a substrate surface, and then forming nucleation sites on the semiconductor material. After forming the nucleation sites, the semiconductor material is annealed and deposits on the substrate surface are removed. The nucleation sites are preferably formed by depositing a material such as silicon substantially preferentially on the semiconductor material. The process of annealing the semiconductor material preferably induces a texturized surface morphology. Furthermore, the process of removing semiconductor deposits from the substrate surface comprises substantially preferentially etching the substrate surface.

In accordance with yet another aspect of the present invention, an array of DRAM storage electrodes juxtaposed on a substrate surface is selectively texturized by a process comprising first forming nucleation sites substantially selectively on the DRAM storage electrodes. Then the DRAM storage electrodes are annealed thereby inducing a textured surface morphology and then the substrate surface is substantially selectively etched, thereby removing deposited material from the substrate surface.

These and other objects and attributes of the present invention will become more fully apparent with the following detailed description and accompanying figures.

DETAILED DESCRIPTION OF THE INVENTION

Figures 1A, 1B:
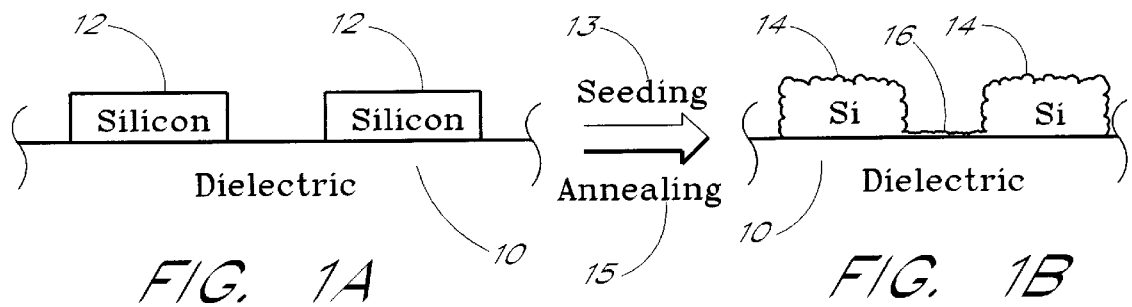
FIGS. 1A, 1B is a schematic section of an exemplary polysilicon electrode texturing process.

As shown schematically in FIG. 1A, a representative embodiment of patterned semiconductor electrodes may comprise localized patterned and etched semiconductor material, such as polysilicon or amorphous silicon deposits 12 disposed on a substrate 10, which may for example comprise a dielectric layer such as $SiO_2$ or BPSG.

A representative seeding process 13 deposits crystallites substantially randomly over the surface of the electrodes 12 as well as the substrate 10. A seeding process 13 may, for example, comprise Low Pressure Chemical Vapor Deposition (LPCVD) of silicon using a silicon hydride (organic or inorganic), for example $SiH_4$. Typical conditions may comprise LPCVD of $SiH_4$ at approximately 10 mtorr and 570° C. for about 10 min., preferably at least in part yielding a selective seed deposition. As those skilled in the art will appreciate, the seeding conditions disclosed herein are only exemplary and serve to describe one possible of affecting electrode texturization.

Subsequent to the seed deposition 13, a representative anneal 15 affects texturization of electrodes 12. A typical prior art anneal may comprise heating the electrodes 12 and dielectric 10 in-vacuo to temperature of approximately 570° C. for approximately 30 minutes. The anneal is carried out at such temperatures as to induce significant atomic migration along the surface. The atomic diffusivity at the seed locations is significantly lower, thereby inducing accumulation of silicon atoms at the seed locations, resulting in growing protrusions, as illustrated by the electrodes 14 in FIG. 1B. A typical seeding/anneal process is performed in a vacuum load-locked cluster tool to prevent the formation of a native oxide layer which freezes the silicon surface and prevents the migration which texturizes the electrodes.

Figure 2:
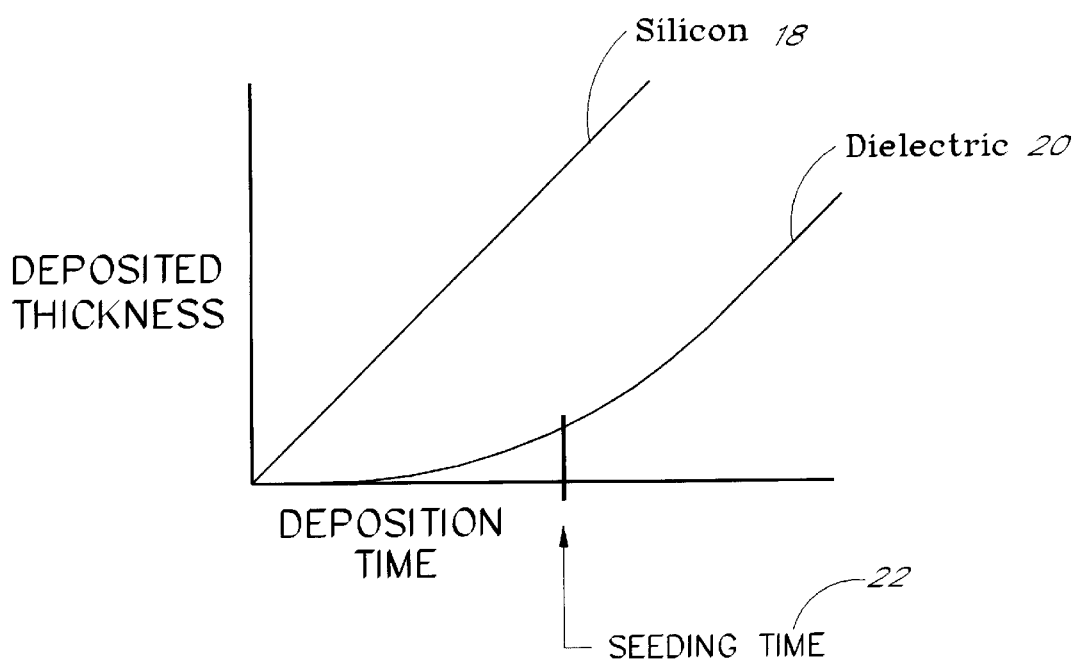
FIG. 2 is a graph of the deposited thickness as a function of deposition seeding time, illustrating process selectivity.

The object of selective texturization is to form as little residue as possible on the neighboring surfaces while generating textured electrodes. As illustrated in FIG. 1B, texturizing usually results in parasitic deposits 16 on the neighboring surfaces, compromising the isolation between electrodes. A selective texturizing process, comprising the aforementioned seeding and incubation steps, exploits differences of incubation time, that is, the relative time over which nucleation sites are formed during seeding deposition, for the silicon surface with respect to neighboring surfaces. As shown in FIG. 2, seeding deposition begins almost immediately for deposition on the silicon as represented by the curve 18. Whereas, for the dielectric 20, seeding begins at a rate slower than that for silicon. The selectivity of the texturing process exploits this difference of incubation rate during the deposition step. For example, the choice of seeding time 22 reflects a compromise between the amount of seeding occurring on the silicon 18 and any parasitic seeding taking place on the dielectric 20. An ideally selective process would render a high seed deposition on silicon while affecting substantially no seed deposition on the dielectric.

Figure 3:
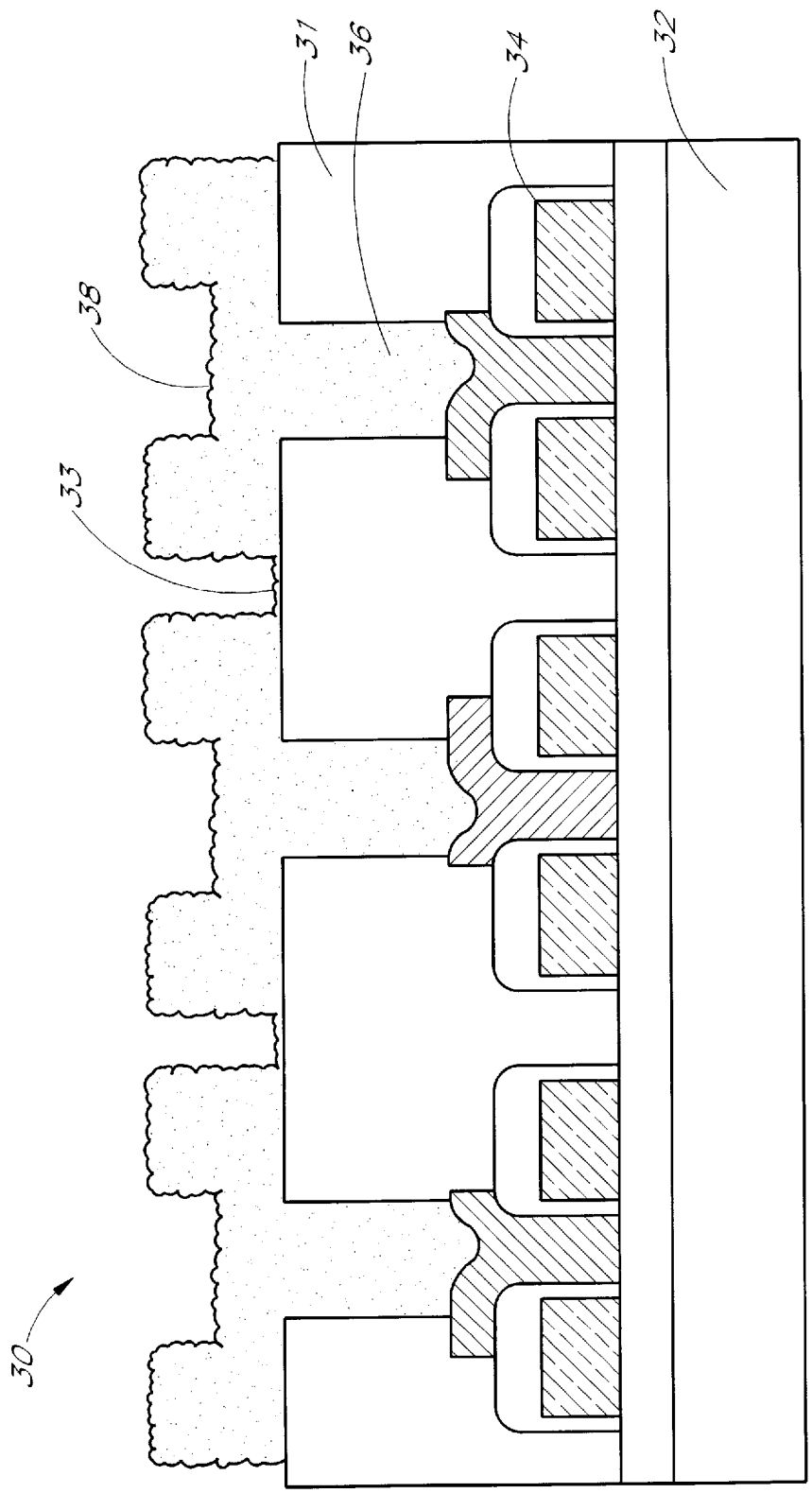
FIG. 3 is a schematic section of an exemplary DRAM texturized storage node electrode.

The foregoing circumstances have direct implications for high density DRAM cells having textured electrodes. As shown in FIG. 3, an exemplary stacked capacitor DRAM structure comprises a silicon substrate 32 upon which are formed the DRAM access devices 34, comprising word and bit lines coupled to the storage node electrodes 38 through MOSFETS. Polysilicon capacitor storage nodes 38 are formed over the access devices 34 and isolated by a dielectric layer 31. In the present exemplary embodiment, the surface area of the storage nodes 38 have been increased by a texturing process, which however has also caused poly deposition 33 on the dielectric layer 31 bridging the storage nodes. Under these circumstances, the texturing process is not completely selective which compromises the isolation between storage nodes.

Figure 4A:
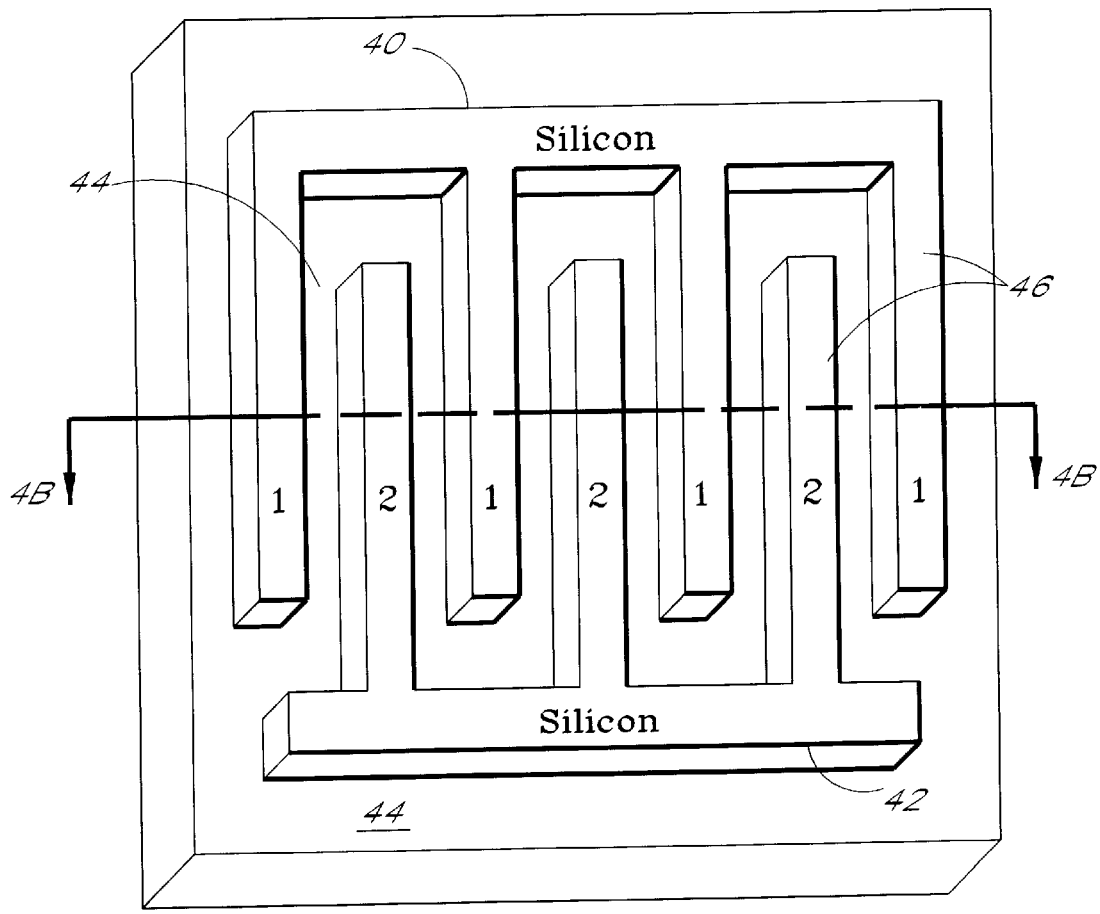
FIG. 4A is a plan view of patterned polysilicon test electrodes on a dielectric substrate, and 4B is a representative section.

To test the effectiveness of selective texturing, polysilicon test electrodes, or fingers, 40, 42 are fabricated on a dielectric substrate 44, as shown in FIG. 4A. The electrodes are subject to a texturing process which desirably increases their surface area, but which may also leave parasitic poly deposits on the intervening dielectric surface 44. The degree of selectivity is determined by measuring the resistance between the electrodes 40, 42 which is indicative of the amount of parasitic poly deposit on the intervening dielectric surface 44. In particular, the amount of parasitic deposit is determined by the resistance between the electrodes 40, 42 which lowers with the amount of parasitic deposit. The interleaving fingers 46 (1,2,1,2 etc.), present a large surface area over which to measure the resistance between electrodes 30 and 32 after a texturing process. The degree of texturing is determined by measuring the capacitance of electrodes 44 and 46 or similar test electrodes with respect to a reference electrode. The capacitance of such textured electrodes is indicative of the degree of texturing and increases in proportion with the electrode surface area.

Figure 4B:
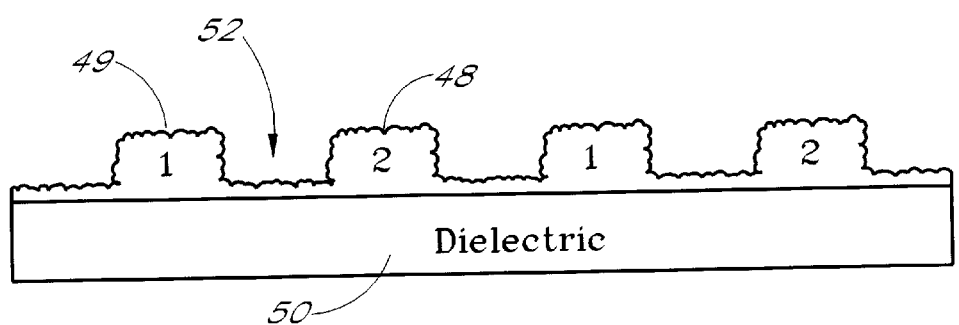

A section of the test pattern after a substantially selective, but not completely selective texturing process is shown in FIG. 4B. The fingers 48 and 49 are connected to respective electrodes 40 and 42. If, during deposition, seeding and growth occurs on the dielectric 50, as well as on the silicon electrodes 48, 49, then a residual or parasitic conductive path 52 is formed between the electrodes 48 and 49. For an ideally selective texturing, the resistance between the electrodes 48, 49 remains substantially infinite.

Figure 5:
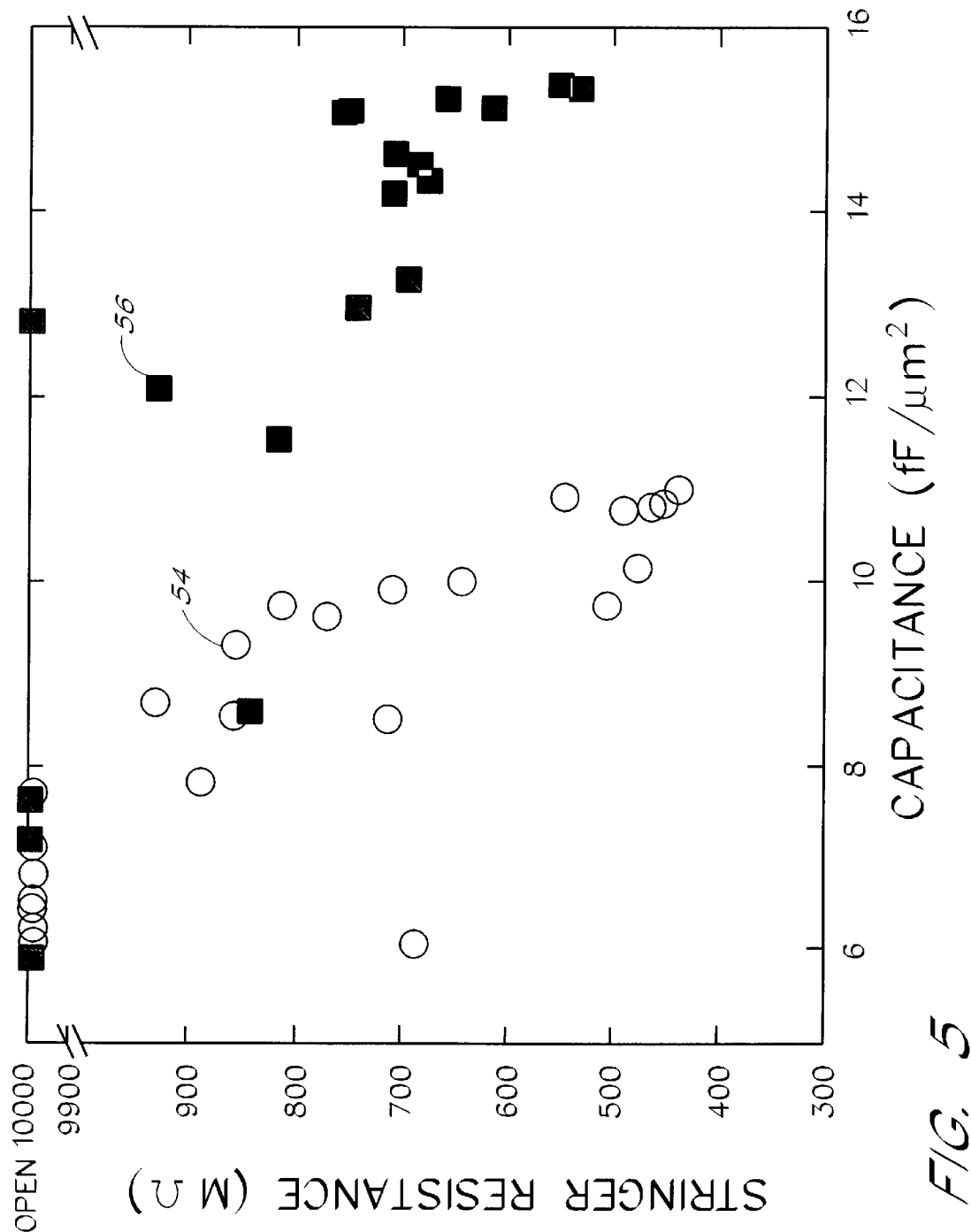
FIG. 5 is a plot of test measurements showing parasitic resistance versus electrode capacitance.

FIG. 5 plots the measured resistance versus capacitance, for a plurality of test patterns subjected to various degrees of electrode texturing. The general trend of the measurements indicates that textured growth, as indicated by higher capacitance, correlates strongly with leakage, as indicated by lower resistance. The groups of measurements represented by the open circles 54 (for doped silane-derived a-Si), and filled boxes 56 (for undoped disilane-derived a-Si), both illustrate substantially the same tendencies: as texturing increases, electrode isolation decreases. The parasitic resistance due to texturing is preferably minimized or eliminated during the texturizing process itself. If the texturizing process is not substantially selective, accumulation on neighboring surfaces may require subsequent aggressive etching processes, which are unfavorable for the electrodes themselves.

In accordance with the principles of the present invention, a preferred texturing process is substantially selective, whereby texturing or material accumulation on neighboring surfaces is significantly less than on the textured electrodes. The substantially selective texturing processes is augmented by means of cleaning or etching processes which remove residual material from the neighboring surfaces, while leaving the textured electrode substantially unetched. In one embodiment of a texturizing post-clean etch process, the texturized electrode/dielectric structure is exposed ex-situ to an etching solution for removal of parasitic silicon deposits on the neighboring dielectric surface. The etching solution should preferably be selective between $SiO_2$ or BPSG (a typical interlayer dielectric) and Si. In particular, the etchant should preferably etch the dielectric at a higher rate than silicon, having selectivities typically grater than 5:1, preferably greater than 10:1 and most preferably greater than 100:1. Possible known selective etchants are: dilute HF and $HNO_3$ solutions, KOH solutions, and mixtures of $NH_4OH$ and $H_2O_2$. These and other selective etchants will remove the parasitic deposits on the dielectric surface, thereby rendering an overall selective texturizing process.

As mentioned earlier, the texturizing process is typically performed in a vacuum load-locked cluster tool. Under these circumstances, a preferred texturizing post-clean or etch comprises an in-situ selective etch to remove parasitic deposits. As discussed in the preceding embodiment, a preferred etch process is selective to the dielectric, usually $SiO_2$, so that deposits are removed as the dielectric top surface layer is etched. For an in-situ process, possible selective etch processes comprise an HF vapor etch or an HF and $HNO_3$ vapor etch. Typically, the etch time will be determined by the etch rate of a particular etchant on a given dielectric and other environmental conditions such as temperature and pressure and flow rate. Typical etch times may be on the order of 15 minutes or less.

Figure 6:
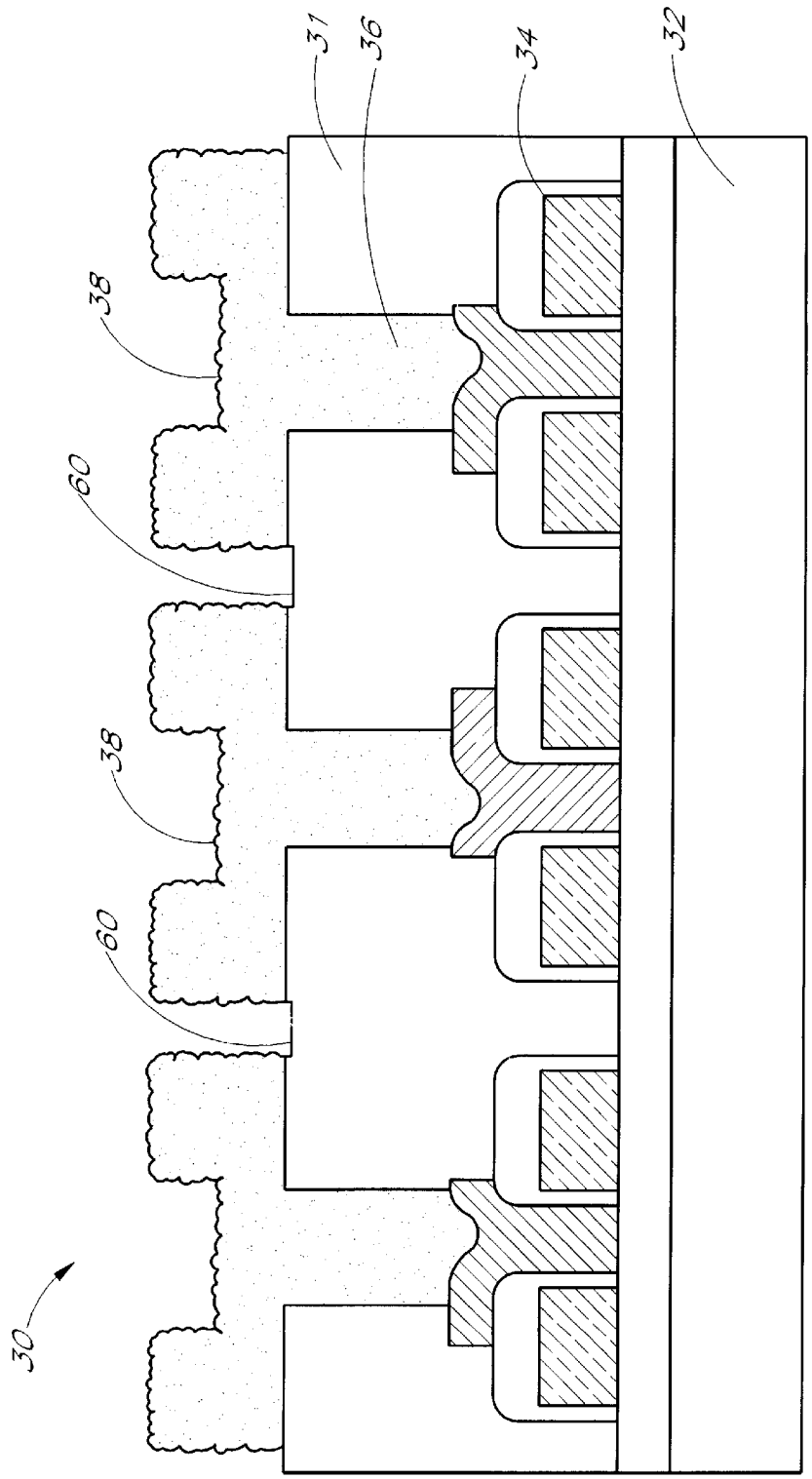
FIG. 6 illustrates the DRAM of FIG. 3 after a selective etch, in accordance with a preferred embodiment.

FIG. 6 illustrates the structure 30 of FIG. 3 following a preferred selective etch. As shown, the dielectric 31 is selectively etched between the storage nodes 38. The removal of the top surface layer of the dielectric 31 results in a slight pitting 60 between the electrodes 38, and the inter-electrode polysilicon deposition 33 (FIG. 3) is removed along with the top surface layer of the dielectric 31.

It will be appreciated that the choice of etchant and etching conditions are to a large extent determined by the materials and processes involved in generating the texturized electrodes and surroundings. In accordance with the present invention, even a substantially non-selective texturizing process can be made selective with an appropriate, preferably selective, etch which removes the parasitic material deposits while leaving the texturized electrodes substantially untouched.

While preferred embodiments of this invention have been disclosed herein, those skilled in the art will appreciate that changes and modifications may be made therein without departing from the spirit and scope of the invention as defined in the appended claims.

What is claimed is:

1. A texturizing process comprising the steps of:
   seeding a semiconductor surface adjacent a substrate surface;
   annealing the seeded surface; and
   removing seeding formations from the substrate surface, wherein seeding comprises inducing nucleation sites in a greater amount on the semiconductor surface than on the substrate surface, and removing seeding formations from the substrate surface comprises selectively etching the substrate surface relative to the semiconductor surface.

2. The process of claim 1, wherein the seeding process comprises chemical vapor depositing a material thereby inducing nucleation sites.

3. The process of claim 1, wherein the step of annealing comprises redistributing the semiconductor surface to induce a texturized morphology.

4. In an array of patterned semiconductor DRAM storage electrodes over a substrate surface and adjacent exposed regions of the substrate surface, a method of selectively texturizing the DRAM storage electrodes by a process comprising:
   depositing nucleation sites in a greater amount on the DRAM storage electrodes than on the substrate surface;
   annealing the DRAM storage-electrodes thereby inducing a textured surface morphology; and
   selectively etching the substrate surface, thereby removing deposited material from the exposed regions of the substrate surface.

5. A process of forming a semiconductor structure, comprising:
   providing a patterned semiconductor material over a substrate surface and adjacent exposed regions of the substrate surface;
   forming nucleation sites on the semiconductor material by depositing a plurality of seed crystals in a greater amount on the semiconductor material than on the exposed regions of the substrate surface;
   removing seed crystals from the exposed regions of the substrate surface; and
   annealing the semiconductor material,
wherein removing seed crystals from the substrate surface comprises substantially preferentially etching the substrate surface.

6. The process of claim 5, wherein annealing the semiconductor material induces a texturized surface morphology.

7. A method of forming isolated and textured semiconductor electrodes over a non-conductive substrate, the method comprising:
   forming at least two electrically isolated electrode structures over an exposed region of the non-conductive substrate;
   forming a plurality of seed crystals over the electrode structures and the exposed region of the non-conductive substrate;
   annealing the electrode structures, thereby redistributing material of the electrode structures; and
   removing the seed crystals from over the exposed region of the non-conductive substrate by selectively etching the material of the substrate.

8. The method of claim 7, wherein forming the seed crystals comprises selectively depositing the seed crystals on the electrode structures.

9. The method of claim 7, wherein the electrode structures comprise polysilicon.

10. The method of claim 7, wherein depositing the seed crystals comprises low pressure chemical vapor deposition of silicon.

11. The method of claim 10, wherein depositing the seed crystals comprises exposing the electrode structures to silane at about 10 mTorr at about 570° C.

12. The method of claim 7, wherein removing the material of the substrate comprises etching the substrate with a selectivity over etching the electrode structures of greater than about 5:1.

13. The method of claim 7, wherein removing the material of the substrate comprises etching the substrate with a selectivity over etching the electrode structures of greater than about 10:1.

14. The method of claim 7, wherein removing the material of the substrate comprises etching the substrate with a selectivity over etching the electrode structures of greater than about 100:1.

15. A process for forming an isolated and texturized electrode in an integrated circuit, comprising:

providing a semiconductor electrode base layer adjacent an exposed insulating substrate region;

depositing crystallization seed upon the electrode base layer and the exposed substrate region; and removing the crystallization seed from over the exposed substrate region without a mask, wherein removing the crystallization seed comprises selectively etching the material of the exposed substrate layer relative to the material of the electrode base layer.

16. The process of claim 15, further comprising annealing the integrated circuit to redistribute the material of the electrode base layer prior to removing the crystallization seed.

17. The process of claim 15, wherein depositing crystallization seeds comprises depositing silicon over the electrode base layer in a greater amount that over the exposed substrate region.

* * * * *